(12) United States Patent
Wort et al.

(10) Patent No.: US 9,142,389 B2
(45) Date of Patent: Sep. 22, 2015

(54) MICROWAVE POWER DELIVERY SYSTEM FOR PLASMA REACTORS

(75) Inventors: Christopher John Howard Wort, Ascot (GB); John Robert Brandon, Ascot (GB)

(73) Assignee: Element Six Technologies Limited, Didcot (GB)

( * ) Notice: Subject to any disclaimer, the term of this patent is extended or adjusted under 35 U.S.C. 154(b) by 177 days.

(21) Appl. No.: 13/994,826

(22) PCT Filed: Dec. 14, 2011

(86) PCT No.: PCT/EP2011/072822
§ 371 (c)(1),
(2), (4) Date: Aug. 23, 2013

(87) PCT Pub. No.: WO2012/084658
PCT Pub. Date: Jun. 28, 2012

(65) Prior Publication Data
US 2013/0334964 A1    Dec. 19, 2013

Related U.S. Application Data

(60) Provisional application No. 61/439,284, filed on Feb. 3, 2011.

(30) Foreign Application Priority Data

Dec. 23, 2010  (GB) .................................. 1021855.0

(51) Int. Cl.
| | |
|---|---|
| H01J 37/32 | (2006.01) |
| C23C 16/27 | (2006.01) |
| C23C 16/511 | (2006.01) |
| C23C 16/54 | (2006.01) |
| H01P 5/20 | (2006.01) |
| H01P 5/22 | (2006.01) |

(52) U.S. Cl.
CPC ........ *H01J 37/32229* (2013.01); *C23C 16/274* (2013.01); *C23C 16/511* (2013.01); *C23C 16/54* (2013.01); *H01J 37/32192* (2013.01); *H01J 37/32256* (2013.01); *H01J 37/32266* (2013.01); *H01P 5/20* (2013.01); *H01P 5/222* (2013.01); *H01J 2237/3321* (2013.01)

(58) Field of Classification Search
CPC .................. H01J 37/32192; H01J 2237/3321; H01J 37/32229; H05H 1/46
USPC ...................................... 315/111.21; 438/772
See application file for complete search history.

(56) References Cited

U.S. PATENT DOCUMENTS

| | | | |
|---|---|---|---|
| 2,547,054 | A | 4/1951 | Smullin |
| 4,869,923 | A | 9/1989 | Yamazaki |
| 4,940,015 | A * | 7/1990 | Kobashi et al. ........ 118/723 AN |
| 4,989,542 | A | 2/1991 | Kamo |
| 5,091,208 | A | 2/1992 | Pryor |
| 5,258,206 | A | 11/1993 | Hayashi et al. |
| 5,261,959 | A | 11/1993 | Gasworth |
| 5,273,731 | A | 12/1993 | Anthony et al. |
| 5,273,790 | A | 12/1993 | Herb et al. |
| 5,302,226 | A | 4/1994 | Yamazaki et al. |
| 5,302,803 | A | 4/1994 | Stevens et al. |
| 5,311,103 | A | 5/1994 | Asmussen et al. |
| 5,397,396 | A | 3/1995 | Kosky et al. |
| 5,501,740 | A | 3/1996 | Besen et al. |
| 5,643,365 | A | 7/1997 | Blinov et al. |
| 5,683,759 | A | 11/1997 | Shepard, Jr. et al. |
| 5,981,057 | A | 11/1999 | Collins |
| 6,091,045 | A | 7/2000 | Mabuchi et al. |
| 6,106,678 | A | 8/2000 | Shufflebotham et al. |
| 6,158,383 | A | 12/2000 | Watanabe et al. |
| 6,254,683 | B1 | 7/2001 | Matsuda et al. |
| 6,284,674 | B1 * | 9/2001 | Toraguchi et al. ............ 438/772 |
| 6,319,439 | B1 | 11/2001 | Lee et al. |
| 6,325,018 | B1 | 12/2001 | Hongoh |
| 6,388,632 | B1 | 5/2002 | Murakawa et al. |
| 6,414,338 | B1 | 7/2002 | Anderson |
| 6,427,621 | B1 | 8/2002 | Ikegawa et al. |
| 6,433,298 | B1 | 8/2002 | Ishii |
| 6,487,986 | B1 | 12/2002 | Liehr et al. |
| 6,565,661 | B1 | 5/2003 | Nguyen |
| 6,645,343 | B1 | 11/2003 | Wild et al. |
| 2001/0023663 | A1 | 9/2001 | Kazumi et al. |
| 2001/0036465 | A1 | 11/2001 | Ishll et al. |

| | | |
|---|---|---|
| 2003/0107003 A1 | 6/2003 | Whitehead |
| 2003/0150561 A1 | 8/2003 | Ishii et al. |
| 2003/0150846 A1 | 8/2003 | Ishii et al. |
| 2003/0200914 A1 | 10/2003 | Noguchi et al. |
| 2004/0045674 A1 | 3/2004 | Ishii et al. |
| 2005/0005853 A1 | 1/2005 | Behle et al. |
| 2005/0109267 A1 | 5/2005 | Linares et al. |
| 2005/0266606 A1 | 12/2005 | Chevallier et al. |
| 2006/0266279 A1 | 11/2006 | Mokuno |
| 2007/0163996 A1 | 7/2007 | Horiguchi |
| 2007/0221294 A1 | 9/2007 | Sasaki |
| 2008/0099768 A1 | 5/2008 | Scarsbrook et al. |
| 2008/0156256 A1 | 7/2008 | Linares et al. |
| 2008/0190356 A1 | 8/2008 | Bhandari |
| 2008/0303744 A1 | 12/2008 | Hirayama et al. |
| 2010/0028556 A1 | 2/2010 | Linares et al. |
| 2010/0034984 A1 | 2/2010 | Asmussen et al. |
| 2010/0178234 A1 | 7/2010 | Noguchi |
| 2010/0189924 A1 | 7/2010 | D'Evelyn et al. |

FOREIGN PATENT DOCUMENTS

| | | |
|---|---|---|
| CN | 101385129 | 3/2009 |
| EP | 0343602 A3 | 11/1989 |
| EP | 0390209 A3 | 10/1990 |
| EP | 0447031 A1 | 9/1991 |
| EP | 0480581 | 9/1991 |
| EP | 0467043 A2 | 1/1992 |
| EP | 0487292 A1 | 5/1992 |
| EP | 0526657 A1 | 2/1993 |
| EP | 0546752 A1 | 6/1993 |
| EP | 0582397 A2 | 2/1994 |
| EP | 0597445 A2 | 5/1994 |
| EP | 0695816 A1 | 2/1996 |
| EP | 0727507 A2 | 8/1996 |
| EP | 0758688 A1 | 2/1997 |
| EP | 0822269 | 4/1998 |
| EP | 1500718 A1 | 1/2005 |
| EP | 1643641 A2 | 4/2006 |
| EP | 1463849 | 1/2007 |
| EP | 2108714 A1 | 10/2009 |
| FR | 2798552 | 3/2001 |
| JP | S62162366 A | 7/1987 |
| JP | S62167886 A | 7/1987 |
| JP | S62235393 A | 10/1987 |
| JP | S-63-265892 A | 1/1988 |
| JP | S63-128600 A | 6/1988 |
| JP | 03281594 C2 | 12/1991 |
| JP | 4009471 A | 1/1992 |
| JP | 4-228495 A | 8/1992 |
| JP | H04238896 | 8/1992 |
| JP | H05013342 A | 1/1993 |
| JP | H061251158 A | 9/1994 |
| JP | H07-169741 A | 7/1995 |
| JP | H07-263185 A | 10/1995 |
| JP | H08133893 A | 5/1996 |
| JP | H09-274999 A | 10/1997 |
| JP | 2001007385 | 1/2001 |
| JP | 2002265296 A | 3/2001 |
| JP | S43-029969 B | 11/2001 |
| JP | 2003045810 A | 2/2003 |
| JP | 2003-142471 A | 5/2003 |
| JP | 2004235434 A | 8/2004 |
| JP | 2004244298 A | 9/2004 |
| JP | 2005-044822 A | 2/2005 |
| JP | 2007142195 | 6/2007 |
| JP | 2007273913 A | 10/2007 |
| JP | 2007284773 A | 11/2007 |
| JP | 2007331955 A | 12/2007 |
| JP | 2006286269 A | 5/2008 |
| JP | 2009280421 A | 12/2009 |
| JP | 2010-170809 A | 8/2010 |
| KR | 20020061768 A | 7/2002 |
| SE | 500740 C2 | 8/1994 |
| WO | 02/077319 A1 | 10/2002 |
| WO | 03/040440 A2 | 5/2003 |
| WO | 2006/117621 | 11/2006 |
| WO | 2006/127611 A2 | 11/2006 |
| WO | 2007/092893 A2 | 8/2007 |
| WO | 2008/025899 | 3/2008 |
| WO | 2008/029258 | 3/2008 |
| WO | 2008/090510 | 7/2008 |
| WO | 2008/123605 A1 | 10/2008 |
| WO | 2010/004836 A1 | 1/2010 |
| WO | 2010/021382 A1 | 2/2010 |
| WO | 2010/084655 | 7/2010 |

OTHER PUBLICATIONS

Balmer et al., Chemical vapour deposition synthetic diamond: materials, technology and applications, Journal of Physics: Condensed Matter, 21, 2009.
Whitfield et al., Nucleation and growth of diamond films on single crystal and polycrystalline tungsten substrates, Diamond and Related Materials, vol. 9, pp. 262-268, 2000.
International Search Report issued on PCT/EP2011/072824, dated May 3, 2012.
Silva et al., Microwave Analysis of PACVD diamond deposition reactor based on electromagnetic materials, Diamond & Related Materials, vol. 19, pp. 397-403, 2010.
Search Report issued on GB1121517.5, dated Mar. 27, 2012.
Funer et al., Simulation and development of optimized microwave plasma reactors for diamond deposition, Surface and Coatings Technology, 1999, 853-862, vol. 116-119.
Hassouni et al., Self-consistent microwave field and plasma discharge simulations for a moderate pressure hydrogen discharge reactor, Journal of Applied Physics, 1999, pp. 134-151, 86(1).
Search Report issued on GB1021913.7, dated Apr. 21, 2011.
Kosky et al., Fracture-free release of CVD diamond, Diamond and Related Materials 5 (1996) pp. 1313-1317.
Asmussen, et al., Multiple substrate microwave plasma-assisted chemical vapor deposition single crystal diamond syntheses, Applied Physics Letters, p. 93, 031502, 2008.
Chae, et al., The 8-inch free-standing CVD diamond wafer fabricated by DC-PACVD, Diamond and Related Materials, 19, 2010, pp. 1168-1171.
Gray, et al., Free-standing CVD diamond wafers for thermal management by d.c. arc jet technology, Diamond and Related Materials 8, 1999, 903-908.
Liao, Samuel Y., Microwave Devices and Circuits, 3d Edition, published by Prentice-Hall, Inc., New Jersey pp. 144-156, 1996.
Hassouni et la., Modelling of diamond deposition microwave cavity generated plasmas, J. Phys. D. Appl. Phys,. 43 (2010) 153001.
Hemawan et a., Improved microwave plasma cavity reactor for diamond synthesis at high-pressure and high power density, Diamond & Related Materials 19 (2010) 1446-1452.
Alam et al., Adhesion of diamond coatings on tungsten substrates, Journal of Adhesion Science and Technology, vol. 9, No. 6, 1995 Netherlands, 653-679.
Feng, et al., Surface stress measurement with interference microscopy of thick homoepitaxial single-crystal diamond layers, Diamond & Related Materials 19 (2010) 1453-1456.
Yamada, Simulation with an improved plasma model utilized to design a new structure of microwave plasma discharge for chemical vapor deposition of diamond crystals, Diamond and Related Materials, 17, Issues 4-5 (2008), pp. 494-497.
Achard, J., et al., Thick boron doped diamond single crystals for high power electronics, Diamond & Related Materials, 20, pp. 145-152, 2010.
Lee, et al., Single-cathode DC PACVD process for large-area CVD diamond wafer fabrication, 203rd Meeting of the Electrochemical Society, Eighth International Symposium on Diamond Materials, 2003.
Funer et al., Numerical simulations of microwave plasma reactor for diamond CVD, Surface and Coatings Technology, 74-75 (1995), pp. 221-226.
International Search Report issued on PCT/EP2011/072820, dated Mar. 30, 2012.
Search Report issued on GB1121474.9, dated Mar. 27, 2012.
Search Report issued on GB1305030.7 dated Apr. 16, 2013.
Search Report issued on GB1305041.4 dated Apr. 15, 2013.
Search Report issued on GB1305045.5 dated Apr. 16, 2013.

Search Report issued on GB1121486.3 dated Apr. 12, 2012.
Search Report issued on GB1021870.9 dated Apr. 6, 2011.
Search Report issued on GB1021865.9 dated Apr. 20, 2011.
Search Report issued on GB1121494.7 dated Apr. 7, 2012.
Search Report issued on GB1021860.0 dated Apr. 20, 2011.
Search Report issued on GB1121492.1 dated Apr. 12, 2012.
Search Report issued on GB1021855.0 dated May 31, 2011.
Search Report issued on GB1121499.6 dated Jan. 27, 2012.
Search Report issued on GB1121505.0 dated Mar. 29, 2012.
International Search Report issued on PCT/EP2011/072825 dated Mar. 30, 2012.
Search Report issued on GB1021853.5 dated Mar. 30, 2011.
International Search Report issued on PCT/EP2011/072823, dated Jul. 4, 2012.
International Search Report issued on PCT/EP2011/072822, dated May 23, 2012.
International Search Report issued on PCT/EP2011/072818, dated Jun. 22, 2012.
International Search Report issued on PCT/EP2011/072821, dated Mar. 2, 2012.
Silva, F., et al., Microwave engineering of plasma-assisted CVD reactors for diamond deposition, Journal of Physics; Condensed Matter, vol. 21, No. 364202, 2009.

* cited by examiner

*Primary Examiner* — John Poos
(74) *Attorney, Agent, or Firm* — Dean W. Russell; Kilpatrick Townsend & Stockton LLP (57) ABSTRACT

A microwave power delivery system for supplying microwave power to a plurality of microwave plasma reactors (8), the microwave power delivery system comprising: a tuner (14) configured to be coupled to a microwave source (4) and configured to match impedance of the plurality of microwave plasma reactors to that of the microwave source; and a waveguide junction (18) coupled to the tuner and configured to guide microwaves to and from the plurality of microwave plasma reactors, wherein the waveguide junction comprises four waveguide ports including a first port coupled to the tuner, second and third ports configured to be coupled to respective microwave plasma reactors, and a fourth port coupled to a microwave sink (20), wherein the waveguide junction is configured to evenly split microwave power input from the tuner through the first port between the second and third ports for providing microwave power to respective microwave plasma reactors, wherein the waveguide junction is configured to decouple the second and third ports thereby preventing any reflected microwaves from one of the microwave plasma reactors from feeding across the waveguide junction directly into another microwave plasma reactor causing an imbalance, wherein the waveguide junction is further configured to feed reflected microwaves received back through the second and third ports which are balanced in terms of magnitude and phase to the tuner such that they can be reflected by the tuner and re-used, and wherein the waveguide junction is further configured to feed excess reflected power which is not balanced through the fourth port into the microwave sink.

14 Claims, 6 Drawing Sheets

MICROWAVE POWER DELIVERY SYSTEM FOR PLASMA REACTORS

FIELD OF THE INVENTION

Certain embodiments of the present invention relate to a microwave power delivery system for supplying microwave power to plasma reactors. Particular embodiments relate to systems for microwave plasma activated chemical vapour deposition of materials such as synthetic diamond material which require high power densities, relatively long synthesis times, and which are relatively sensitive to variations in microwave power over the time period required for synthesis.

BACKGROUND OF THE INVENTION

Chemical vapour deposition (CVD) processes for manufacture of synthetic diamond material are now well known in the art. Being in the region where diamond is metastable compared to graphite, synthesis of diamond under CVD conditions is driven by surface kinetics and not bulk thermodynamics. Synthetic diamond manufacture by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, diamond can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

One of the main costs of such a system is the microwave power source. Furthermore, one of the main costs of operating such a system is the cost of electricity required to run the microwave power source. Accordingly, it is desirable to configure the system to try and minimize these hardware and operational costs. It is an aim of certain embodiments of the present invention to provide a microwave power delivery system for supplying microwave power to plasma reactors which is cost efficient in terms of both hardware usage and power efficiency while also enabling the CVD synthesis of high quality, reproducible CVD films, particularly for use in CVD diamond synthesis.

SUMMARY OF THE INVENTION

According to one embodiment of the present invention there is provided a microwave power delivery system for supplying microwave power to a plurality of microwave plasma reactors, the microwave power delivery system comprising:
  a tuner configured to be coupled to a microwave source and configured to match impedance of the plurality of microwave plasma reactors to that of the microwave source; and
  a waveguide junction coupled to the tuner and configured to guide microwaves to and from the plurality of microwave plasma reactors,
  wherein the waveguide junction comprises four waveguide ports including a first port coupled to the tuner, second and third ports configured to be coupled to respective microwave plasma reactors, and a fourth port coupled to a microwave sink,
  wherein the waveguide junction is configured to evenly split microwave power input from the tuner through the first port between the second and third ports for providing microwave power to respective microwave plasma reactors,
  wherein the waveguide junction is configured to decouple the second and third ports thereby preventing any reflected microwaves from one of the microwave plasma reactors from feeding across the waveguide junction directly into another microwave plasma reactor causing an imbalance,
  wherein the waveguide junction is further configured to feed reflected microwaves received back through the second and third ports which are balanced in terms of magnitude and phase to the tuner such that they can be reflected by the tuner and re-used, and
  wherein the waveguide junction is further configured to feed excess reflected power which is not balanced through the fourth port into the microwave sink.

According to another embodiment of the present invention there is provided a microwave plasma reactor system comprising:
  a microwave source;
  a microwave power delivery system as defined above coupled to the microwave source; and
  a plurality of microwave plasma reactors coupled to the microwave power delivery system.

According to another embodiment of the present invention there is provided a method of synthesising diamond material using a chemical vapour deposition process, the method comprising:

provided a microwave plasma reactor system as described above; and forming synthetic diamond material using said microwave plasma reactor system.

BRIEF DESCRIPTION OF THE DRAWINGS

For a better understanding of the present invention and to show how the same may be carried into effect, certain embodiments of the present invention will now be described by way of example only with reference to the accompanying drawings, in which.

DETAILED DESCRIPTION OF EMBODIMENTS OF THE INVENTION

Figure 1:
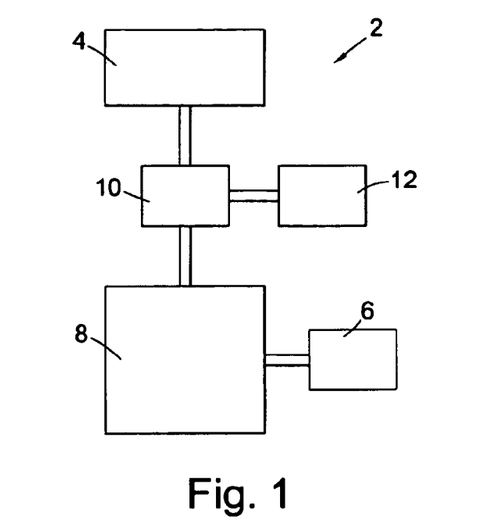
FIG. 1 illustrates a microwave plasma reactor system not according to the present invention which consists of a single microwave plasma reactor coupled to a single microwave generator via an isolator.

FIG. 1 shows a schematic illustration of a microwave plasma activated CVD diamond synthesis system 2. The system 2 comprises a microwave generator 4 and source gases 6 coupled to a plasma reactor chamber 8. The microwave generator 4 is typically coupled to the plasma reactor chamber 8 via an isolator 10 which functions to isolate the microwave generator from any microwave power reflected back towards the microwave generator. Isolators are known in the art. An isolator is a device that transmits microwave power in one direction only. It is used to shield equipment on its input side, from the effects of conditions on its output side, for example, to prevent a microwave source being detuned by a mismatched load. An example of an isolator is a circulator. Any reflected microwave power reflected back towards the microwave generator is diverted to a sink 12 which may be, for example, a water load.

Figure 2:
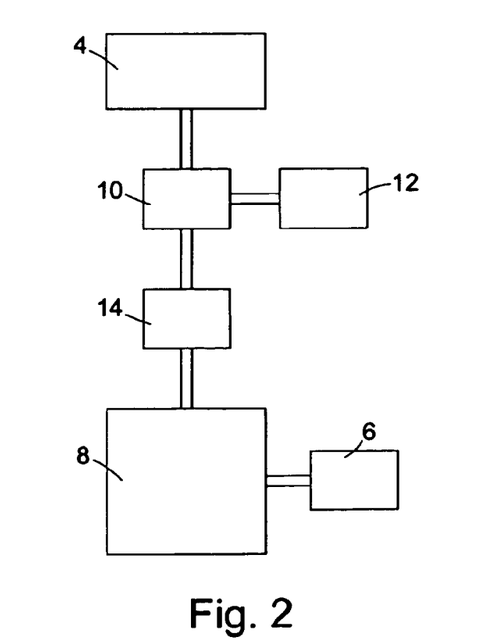
FIG. 2 illustrates a microwave plasma reactor system not according to the present invention which consists of a single microwave plasma reactor coupled to a single microwave generator via an isolator and a tuner.

The present inventors have realized that the use of an isolator as outlined above leads to a significant amount of power being lost. As such, the system illustrated in FIG. 1 is not particularly efficient from a power usage perspective. One possible improvement is to provide a tuner 14 between the plasma reactor chamber 8 and the isolator 10 as illustrated in FIG. 2. Tuners are known in the art and may be conveniently provided in the form of a stub tuner, for example a multiple stub tuner such as a three or four stub tuner. The tuner is configured to match the impedance of the microwave plasma reactor chamber 8 to that of the microwave generator/source 4. The tuner 14 ensures that microwave power feeding back from the plasma reactor chamber 8 can be reduced to a minimum thus improving power efficiency. The tuner effectively functions as a reflectometer which reflects microwave power from the microwave plasma reactor chamber 8 back towards the microwave plasma reactor 8. Any power which leaks through the tuner 14 back towards the microwave generator 4 can be isolated from the generator using a single isolator 10. Such an arrangement will improve power efficiency.

The present inventors have noted that power efficiency using the aforementioned system is still not particularly high, even using an isolator and tuner combination as illustrated in FIG. 2. The reason for this is that the power available from a standard L-band industrial microwave generator (e.g. about 60-75 kW) may be at least twice as large as the typical power requirement of a microwave plasma activated CVD diamond reactor (e.g. at least 10 kW). Accordingly, if a single microwave plasma activated CVD diamond reactor is run from a single standard microwave generator, much of the potential power available from the microwave generator is not being utilized. This is not an efficient use of resources, especially since a microwave generator accounts for a significant portion of the overall cost of a microwave plasma activated CVD diamond reactor system. One possibility would be to use a lower power microwave generator so as to better match the power requirements of a microwave plasma activated CVD diamond reactor. However, this is not particularly cost effective as the cost of an L-band source does not scale according to the power of the source. Similar comments may also apply to S-band microwave sources in terms of power efficiency although from a cost perspective the benefits are not so clear cut as the cost of an S-band microwave source reduces with a reduction in power.

Figure 3:
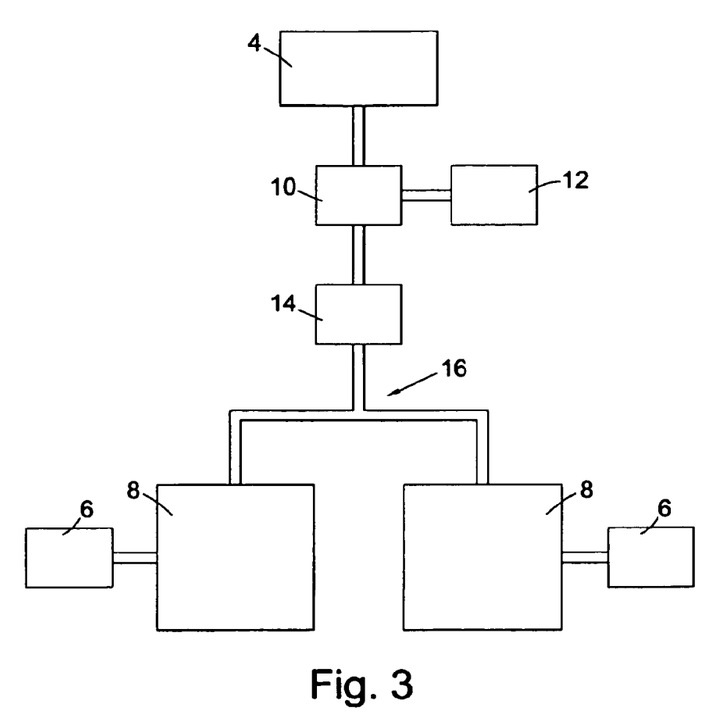
FIG. 3 illustrates a microwave plasma reactor system not according to the present invention which consists of two microwave plasma reactors coupled to a single microwave generator via an isolator, a tuner, and a waveguide junction such as a rectangular waveguide tee.

In light of the above, it would be desirable for more than one microwave plasma activated CVD diamond reactor to be coupled to a single microwave generator. However, this is far from straightforward in practice. One such possible configuration is illustrated in FIG. 3. The configuration illustrated in FIG. 3 is similar to that illustrated in FIG. 2 in that it comprises a microwave generator 4, an isolator 10 coupled to a sink 12, and a tuner 14. Thereafter, the configuration further comprises a microwave splitter 16, such as a rectangular waveguide tee, which splits the microwave power and feeds the power towards two microwave plasma reactors 8, each microwave plasma reactor 8 being coupled to a source of reactant gases 6. As a typical industrial microwave generator can provide at least twice as much power as that required by a microwave plasma reactor, it is envisaged that such an arrangement will provide a more efficient usage of the available power and lead to a more cost effective arrangement when compared with configurations such as those illustrated in FIGS. 1 and 2. However, the present inventors have found that a system such as that illustrated in FIG. 3 results in poor synthetic diamond film formation and poor reproducibility of film formation between the two plasma reactors and between synthesis runs.

The present inventors have traced the aforementioned problem to an imbalance in the microwave power delivered to each of the plasma reactors coupled to the single microwave power source. The present inventors have found that if one simply splits the microwave power between two microwave plasma activated CVD diamond reactors using, for example, a rectangular waveguide tee, power is typically reflected back from the reactors due to imperfect matching. An imbalance in the microwave power may result as the amount of reflected power from each plasma reactor will not be perfectly balanced during a CVD diamond manufacturing process. The problem is exacerbated by the fact that isolation between the two ports coupled to the respective plasma reactors is not ideal and that reflected power from one port can then propagate to the other port effectively causing a power imbalance and cross-talk between the plasma reactors. This is a particular problem with plasma reactors, most particularly high power plasma reactors for CVD diamond synthesis, as the response of the plasma reactors is non-linear and the time required to perform CVD diamond synthesis is long. As such, if only a relatively simple microwave power splitter is used to equally split the microwave power between a plurality of plasma reactors, there is a significant risk that a power imbalance will result between any two microwave plasma CVD diamond reactors coupled to the splitter, even if the reactors are nominally being run with the same operating parameters. This will cause the operating parameters of each plasma reactor to deviate from desired operating conditions leading to variations in the CVD product obtained from each of the plasma reactors and variations between synthesis runs.

One solution to the aforementioned problem is to provide each plasma reactor with its own microwave power source so that the systems are completely decoupled. However, as stated previously this solution is expensive and inefficient.

So, the problem becomes how to use a single microwave generator for multiple (two or more) microwave plasma CVD diamond reactors while ensuring that the microwave power input to each plasma reactor remains balanced despite variations between the reflected power from each plasma reactor.

Figure 4:
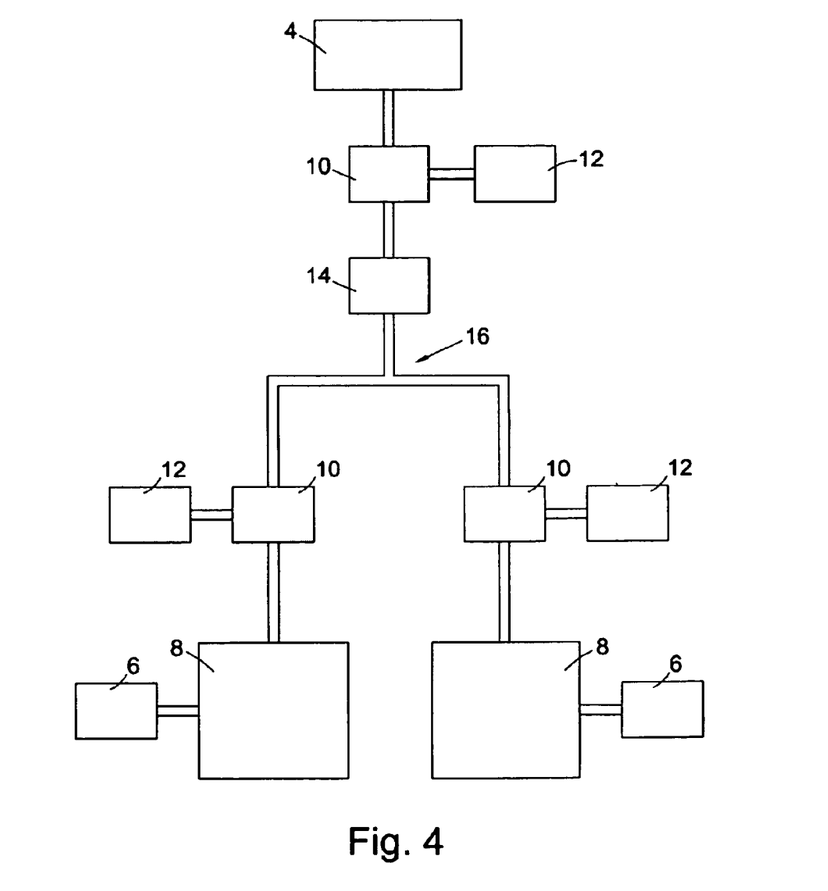
FIG. 4 illustrates a microwave plasma reactor system not according to the present invention which consists of two microwave plasma reactors coupled to a single microwave generator via an isolator, a tuner, and a waveguide junction such as a rectangular waveguide tee, wherein a further isolator is provided at each port connecting the waveguide junction to the two microwave plasma reactors.

One possible solution is to provide isolators at each port coupled to a plasma reactor. Such an arrangement is illustrated in FIG. 4. The illustrated arrangement comprises a microwave generator 4, an isolator 10 coupled to a sink 12, a tuner 14 and a microwave splitter 16 as previously illustrated in FIG. 3. However, in the configuration shown in FIG. 4, a further isolator 10 with an associated sink 12 is provided at each reactor port to prevent reflected microwave power causing an imbalance in the system. That is, the provision of an isolator at each port coupled to a plasma reactor would prevent any reflection of microwave power back toward the microwave generator and therefore prevent fluctuations of power in the microwave delivery system. In this way a waveguide tee can in principle provide an equal power split without risk of cross-talk.

One problem with the aforementioned solution is that it is a very expensive approach. Isolators themselves are very expensive and in the previously described arrangement an isolator would be required at each port coupled to a plasma reactor. Furthermore, isolators can only be manufactured within certain design tolerances and thus the isolators will not necessarily function in a perfectly identical fashion. Differences in input reflections, isolations between adjacent ports, and insertion losses can all result in an inherent imbalance within the microwave supply system. Further still, the isolators will dump all, or substantially all, reflected microwave power into a sink, such as a water load, such that the power is lost and cannot be reused. Overcoming this is problematic as each plasma source will require its own independent matching network and means of measuring reflected power independently of the other load. Accordingly, this is an inherently expensive and inefficient system to configure.

In light of the above, an alternative solution is required which is both cost effective from a hardware perspective and efficient from a power usage perspective, while also ensuring that the microwave power input to each plasma reactor remains balanced regardless of fluctuations in power usage and fluctuations in power reflected back into the microwave supply system.

It is an aim of certain embodiments of the present invention to at least partially solve one or more of the problems described above.

The aforementioned problems have been solved in accordance with certain embodiments of the present invention by providing a microwave power delivery system for supplying microwave power to a plurality of microwave plasma reactors, the microwave power delivery system comprising:

a tuner configured to be coupled to a microwave source and configured to match impedance of the plurality of microwave plasma reactors to that of the microwave source; and a waveguide junction coupled to the tuner and configured to guide microwaves to and from the plurality of microwave plasma reactors, wherein the waveguide junction comprises four waveguide ports including a first port coupled to the tuner, second and third ports configured to be coupled to respective microwave plasma reactors, and a fourth port coupled to a microwave sink, wherein the waveguide junction is configured to evenly split microwave power input from the tuner through the first port between the second and third ports for providing microwave power to respective microwave plasma reactors, wherein the waveguide junction is configured to decouple the second and third ports thereby preventing any reflected microwaves from one of the microwave plasma reactors from feeding across the waveguide junction directly into another microwave plasma reactor causing an imbalance, and wherein the junction is further configured to feed reflected microwaves through the second and third ports which are balanced in terms of magnitude and phase back to the tuner such that they can be reflected and re-used, and wherein the waveguide junction is further configured to feed excess reflected power which is not balanced through the fourth port into the microwave sink.

The tuner is configured to match the impedance of the microwave plasma reactors to that of the source. This component ensures that microwave power feeding back from the plasma reactors can be reduced, thus improving power efficiency. The tuner effectively reflects microwave power from the microwave plasma reactor chamber back towards the microwave plasma reactor. Any power which leaks through the tuner back towards the microwave generator can be isolated from the source using a single isolator.

An example of a suitable tuner is a multiple stub tuner such as a three stub tuner. Such a tuner comprises adjustable stubs attached to a main conduit. The tuner in effect creates an impedance which is the conjugate of that of the mismatched load. If well designed, the stubs can be adjusted in length and in combinations that equate to a reactance (capacitance or inductance) that, relative to a given reference plane, can in effect compensate for a reflection of any phase up to a magnitude of reflection coefficient in the region of typically 0.3 at high powers before there is a risk of overheating or waveguide arcing. Put simply, the stub tuner can be configured to match the impedance of the microwave source (the output port of the microwave generator's isolator) to that of the plasma load (the input ports of the plasma reactors). In one configuration which has been found to be useful, the stubs are separated by a quarter guided wavelength.

Examples of suitable waveguide junctions include a hybrid tee junction, a hybrid ring junction, and a two-hole directional coupler. The junction is configured to perform three primary functions: (i) to equally split microwave power from the tuner between each of a plurality of plasma reactors coupled to the junction; (ii) to ensure that the power fed to each of the plasma reactors remains equally balanced even when power is reflected back from each of the plasma reactors into the junction, said reflected power being variable in magnitude and phase; (iii) to ensure that most of the power reflected back from the plurality of plasma reactors is re-used to achieve good power efficiency.

To fulfil the functional requirements as outlined above, the junction must have a very precise geometric configuration so as to evenly split microwave power input from the tuner while decoupling the outputs to each of the plasma reactors thereby preventing any reflected power from feeding across directly into another plasma reactor causing an imbalance due to cross-talk. Simultaneously, the junction geometry should be such that reflected power which is balanced should be fed back to the tuner such that it can be re-used. Finally, the junction geometry should be configured such that only the excess reflected power which is not balanced in terms of magnitude and phase is dumped into a sink, such as a water load.

There are several possible waveguide junctions that can fulfil these functional requirements including a hybrid tee junction, a hybrid ring junction, and a two-hole directional coupler. These waveguide junctions are known in the art of microwave waveguides. For a more detailed discussion of their functionality see, for example, the text book "Microwave Devices & Circuits" by Samuel Y. Liao, $3^{rd}$ Edition, published by Prentice-Hall Inc., New Jersey. The most pertinent sections include the section bridging pages 146 to 147 describing the structure and function of a hybrid tee, the section bridging pages 147 and 148 describing a hybrid ring, and the section from page 151 describing a two-hole directional coupler. Any one of these waveguide junctions may in principle be configured to function in the manner described above. The hybrid tee is considered to be the best option for coupling microwave power to a plurality of microwave plasma reactors in accordance with embodiments of the present invention because of its simplicity and because it is capable of operating in the stated fashion over a range of wavelengths. Although the operating range is fairly narrow in bandwidth, it has been surprisingly found that the operating bandwidth is sufficient for the described application. In contrast, a hybrid ring structure can only maintain the stated functionality over a very narrow bandwidth and thus is a less preferred solution as it will be more difficult to maintain the functional characteristics in the present application. While it is also considered that a two-hole directional coupler could also be configured for the present application, this solution is considered a more complicated configuration which will be more difficult to implement in practice.

The first, second, third and fourth ports are formed by rectangular waveguides. If the waveguide junction is a hybrid tee junction, the first, second and third ports can be configured to lie in a plane with the first port disposed at a 90° angle relative to the second and third ports which are disposed in a straight line, and wherein the fourth port is coupled at a junction between the first, second and third ports and lies in a plane perpendicular to the first, second and third ports. The second and third ports of the waveguide junction can be coupled to respective plasma reactors by respective coaxial waveguides. The coupling may be direct or via linking waveguides.

The exact dimensions of the waveguide junction will depend on the desired operating frequency of the plasma reactors. Only a limited number of operating frequencies are permitted by legislation including, for example, 433 MHz, 896 MHz (in the UK—in mainland Europe, the Americas and Asia this standard is 915 MHz), and 2450 MHz. The waveguide junction may be configured to have suitable dimensions to decouple the second and third ports when operating at one of these permitted frequencies. A skilled person in the art of microwave waveguide design will be able to configure a waveguide junction to meet these specifications given the teachings of the present specification and their common general knowledge. For example, the waveguide junction may be configured to decouple the second and third ports when operating within a frequency band width in the range 400 MHz to 500 MHz, 800 MHz to 1000 MHz, or 2300 MHz to 2600 MHz.

It should be noted that while the aforementioned components are known independently in the art of power splitting, impedance matching and isolation, it is believed that the combination of these components and their use in a microwave supply system coupled to a plurality of plasma reactors is not known in the art of CVD diamond synthesis. Furthermore, it was a surprising result that waveguide junctions as described could be used in a power delivery system for microwave plasma reactors configured to synthesis CVD diamond due to their narrow bandwidth of operation.

Microwave power delivery systems as described herein are cost effective from a hardware perspective and efficient from a power usage perspective, while also ensuring that the microwave power input to each plasma reactor remains balanced regardless of fluctuations in power usage and power reflected back into the microwave supply system.

Figure 5:
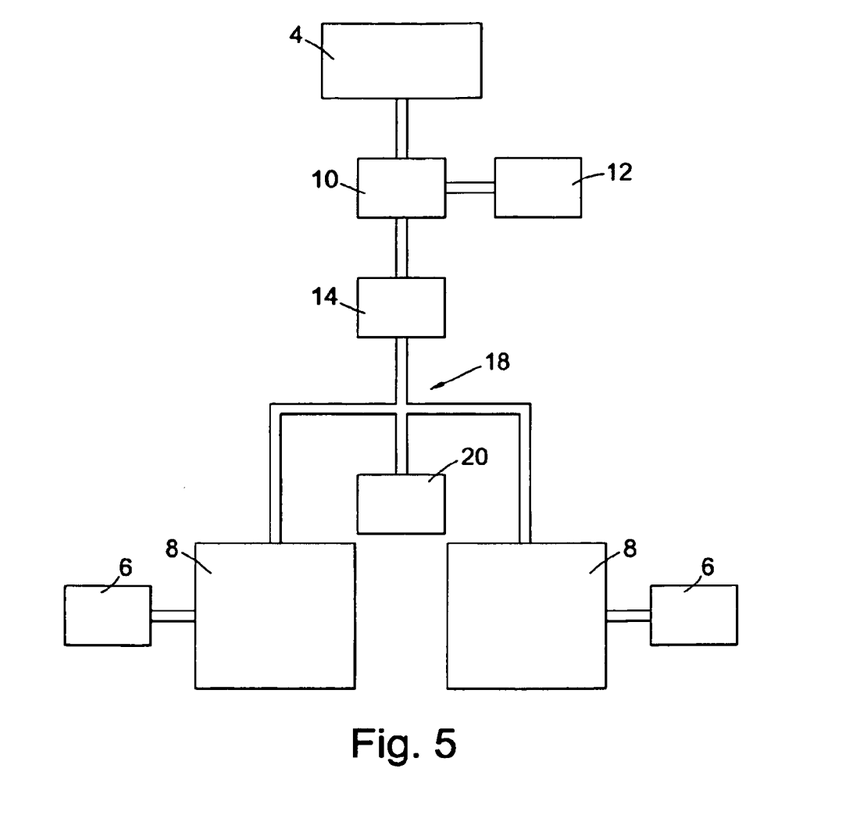
FIG. 5 illustrates a microwave plasma reactor system according to an embodiment of the present invention which comprises two microwave plasma reactors coupled to a single microwave generator via an isolator, a tuner, and a waveguide junction having outputs to the microwave plasma reactors which are effectively de-coupled from each other such that microwave power reflected back from one reactor is prevented from passing through the waveguide junction directly into the other reactor.

FIG. 5 illustrates a microwave plasma reactor system according to an embodiment of the present invention which comprises two microwave plasma reactors 8 coupled to a single microwave generator 4 via an isolator 10 coupled to a sink 12, a tuner 14, and a waveguide junction 18 configured whereby the outputs to the microwave plasma reactors 8 are effectively de-coupled from each other such that microwave power reflected back from one reactor is prevented from passing through the waveguide junction 18 into the output for the other reactor. The waveguide junction 18 must have a very precise geometric configuration so as to evenly split microwave power input from the tuner 14 while decoupling the outputs to each of the plasma reactors thereby preventing any reflected power from feeding across directly into another plasma reactor causing an imbalance due to cross-talk. Simultaneously, the junction geometry should be such that reflected power which is balanced should be fed back to the tuner 14 such that it can be re-used. Finally, the junction geometry should be configured such that only the excess reflected power which is not balanced is dumped into a sink 20, such as a water load.

Figure 6:
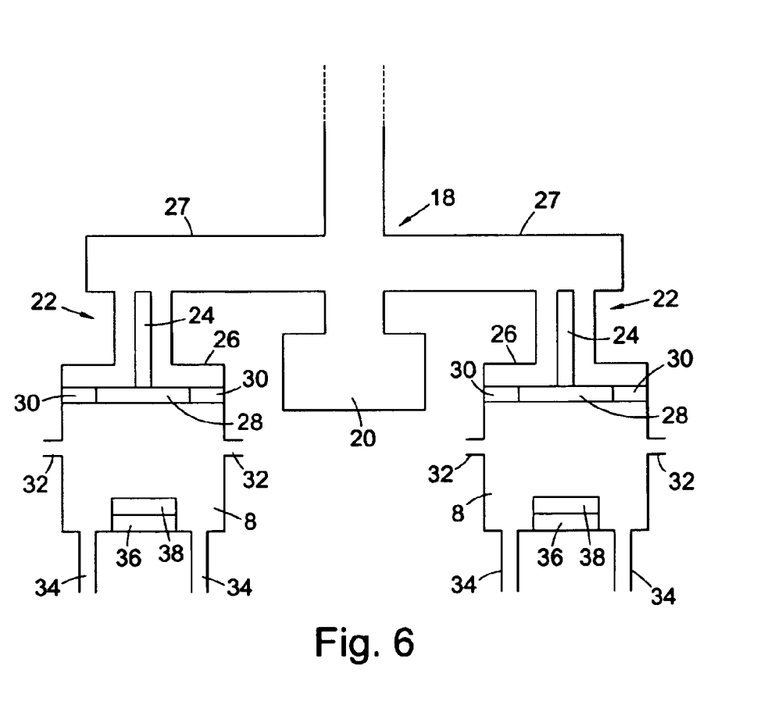
FIG. 6 illustrated a lower portion of the arrangement illustrated in FIG. 5 in more detail.

FIG. 6 shows a lower portion of the microwave plasma reactor system of FIG. 5 in more detail. The waveguide junction 18 is shown connected to a sink 20 and to two CVD diamond microwave plasma reactors 8 via rectangular waveguides 27. The rectangular waveguides 27 are equal in length and are coupled to respective plasma reactors via coaxial waveguides 22.

Each coaxial waveguide comprises an inner conductor 24 and outer conductor 26. In the illustrated arrangement, the inner conductor 24 is a floating post conductor with an end terminating within the waveguide rather than being grounded on a top surface of the rectangular waveguide 27 extending from the waveguide junction 18. The inner conductor can be support on a top plate 28 of the plasma reactor 8. Having the inner conductor of the coaxial waveguide electrically floating in the waveguide has been found to provide a more convenient method of transferring power from the rectangular waveguide 27 to the coaxial waveguide 22 rather than using a grounded post arrangement (although a grounded post arrangement can be used).

The coaxial waveguide 22 guides the microwaves into the plasma chamber 8 through an annular dielectric window 30. Each plasma chamber 8 comprises one or more gas inlets 32 and one or more gas outlets 34. A substrate holder 36 is supported on a base of the chamber and a substrate 38 is provided on the substrate holder 36 in use for depositing CVD diamond thereon.

Figure 7:
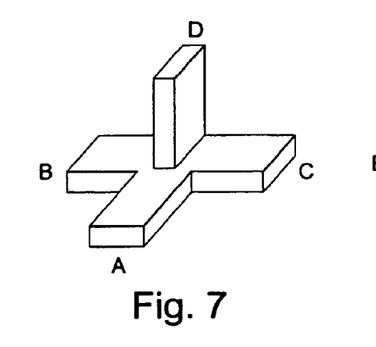
FIG. 7 illustrates a waveguide junction for use in an embodiment of the present invention comprising an input port A, two output ports B and C, and a port D couplable to a sink, wherein ports B and C are decoupled and matched.

FIG. 7 illustrates an example of a junction for use in an embodiment of the present invention comprising an input port A, two output ports B and C, and a port D couplable to a sink, wherein ports B and C are decoupled and matched. In such an arrangement, ports A and D are also decoupled and matched. An example of a suitable junction is a hybrid tee junction which is also known as a "magic-tee" junction. The term "magic-tee" is a term of art which will be understood by a person skilled in the art of microwave splitters. The magic-tee junction comprises four ports A to D as illustrated in FIG. 7. Ports A and D are completely decoupled by way of their symmetry. As such, they can be independently matched, for example, using a tuner. Theory tells us that ports B and C will then also be decoupled and matched. It should be noted however that although ports A and D are decoupled by symmetry, and so are decoupled at all frequencies, ports B and C will only be decoupled and matched at a particular frequency. Approximate matching and decoupling will hold for a small band of frequencies close to this particular frequency, but matched magic-tee junctions are inherently narrow-band devices.

Given that such junctions are inherently passive narrow-band devices, a skilled person may consider that they are not suitable for use with plasma reactors configured to perform highly dynamic processes such as CVD synthetic diamond manufacture. It is surprising that fluctuations in such processes, resulting in changes to the phase of reflected power from each chamber, can be sufficiently well correlated between two or more chambers that a passive element such as a magic tee is able to deliver power equally, and thus efficiently, to all loads.

Figure 8:
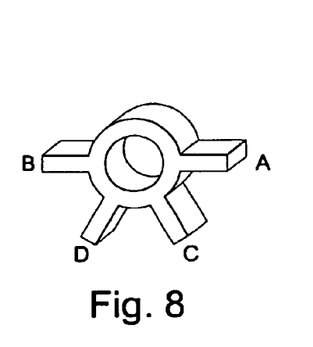
FIG. 8 illustrates another example of a waveguide junction for use in an embodiment of the present invention comprising an input port A, two output ports B and C, and a port D couplable to a sink, wherein ports B and C are decoupled and matched.

FIG. 8 illustrates another example of a junction for use in an embodiment of the present invention comprising an input port A, two output ports B and C, and a port D couplable to a sink, wherein ports B and C are decoupled and matched. This arrangement is known as a hybrid ring. While such an arrangement can function in a similar manner to the previously described hybrid tee junction, hybrid ring junctions tend to operate over a narrower band of frequencies than hybrid tee junctions. As such, the hybrid tee junction is considered to be the better solution so as to provide more scope for tuning to CVD diamond reactors in use.

Advantageously, each plasma reactor coupled to the microwave delivery system is designed to provide a low Q factor resonance cavity in use (i.e. with plasma present in the plasma chamber). That is, the resonance cavities are weakly resonant and are highly damped, with a high rate of energy loss. The Q factor is the ratio of energy stored/energy dissipated per cycle. The Q factor may be modified by modifying the volume of the chamber and the volume and conductivity of the plasma. A small, weakly conductive plasma in a large cavity might be expected to have a higher Q factor than a large volume plasma in a small cavity. Accordingly, a small cavity with a large plasma volume is considered preferable for this additional reason. This condition can most readily be achieved by providing a small plasma chamber. The volume of the resonance cavity may be in a range $0.002$ m$^3$ to $0.06$ m$^3$, $0.007$ m$^3$ to $0.04$ m$^3$, $0.01$ m$^3$ to $0.03$ m$^3$, or $0.015$ m$^3$ to $0.025$ m$^3$. As such, these chambers can form a low Q-factor resonance cavity, e.g. not more than 1000, 500, 200, 100, 80, 50, 30, or 20 in use. These dimensions are particularly preferred for operation at a microwave frequency in the range 800 MHz to 1000 MHz. For an operating frequency of 400 to 500 MHz, the volume of the resonance cavity may be in a range $0.018$ m$^3$ to $0.530$ m$^3$, $0.062$ m$^3$ to $0.350$ m$^3$, $0.089$ m$^3$ to $0.270$ m$^3$, or $0.133$ m$^3$ to $0.221$ m$^3$. For an operating frequency of 2300 to 2600 MHz, the volume of the resonance cavity may be in a range $9.8\times10^{-5}$ m$^3$ to $2.9\times10^{-3}$ m$^3$, $3.4\times10^{4}$ m$^3$ to $1.96\times10^{-3}$ m$^3$, $4.9\times10^{4}$ m$^3$ to $1.47\times10^{-3}$ m$^3$, or $7.35\times10^{4}$ m$^3$ to $1.23\times10^{-3}$ m$^3$.

Such cavities have a larger range of frequencies at which they resonate and thus operate at larger band widths. This is important because plasma reactors will have different resonance characteristics with the plasma present than without the plasma. Systems according to certain embodiments of the present invention are able to start without re-tuning as resonance can be achieved in the reactor cavity with or without the plasma present due to the low Q factor of the resonance cavity. As previously described, the tuning of the presently described arrangement cannot be unduly varied as the waveguide junction only functions in the desired manner over a narrow bandwidth. Accordingly, it is desirable that the plasma reactors can be operated over only a narrow bandwith corresponding to the operational band width of the junction. Furthermore, a high Q cavity will show a large change in phase and magnitude of reflection with frequency. This means they will be less tolerant of any small differences in manufacturing tolerances etc. and it will be harder for a single matching stub tuner to simultaneously correct for the power reflected from both plasma loads, resulting in an inevitable power imbalance.

The waveguide junction may thus be precisely geometrically configured to split microwave power from one port, equally between at least two ports, which are coupled to respective plasma reactors. The junction is also configured to transmit reflected power which is matched from said two ports back up said one port, and dump any mismatched power into a fourth port. In other words, if the two plasma loads have identical impedance, as measured at equivalent reference planes on port two and port three, all of the reflected power will appear at port one. The two ports coupled to the plasma reactors are preferably of precisely equal length or have a difference in length which is a multiple of ½ $\lambda_g$, where $\lambda_g$ is the operating guided wavelength, for example for the $TE_{10}$ mode most commonly used in rectangular waveguide. This ensures that these two ports will be matched and decoupled. Very small design tolerances are required for retaining decoupling and matching of the junction ports (e.g., within 10 mm, 5 mm, 3 mm, 1 mm, 0.5 mm, or 0.1 mm and/or within 4%, 2%, 1%, 0.5%, 0.2%, 0.1% or 0.06% of a target port length).

So, a junction such as a magic-tee junction provides an arrangement in which the ports coupled to the plasma reactors are decoupled while enabling a simple and convenient method of matching. Approximate matching and decoupling will hold for a small band of frequencies only. For example, magic-tee junctions give the best performance over a relatively narrow band of frequencies. However, it has been surprisingly found that resonance in a plasma reactor can be achieved with or without a plasma present within such a relatively narrow band of frequencies, particularly if the microwave plasma reactors are configured to have a low Q factor. It should be noted that both the tuner and the junction should be configured to function at the operational frequency of the plasma reactors. A stub tuner could in principle work over a very wide range of frequencies. However, the operational frequency and bandwidth varies between designs. The present inventors have found that a stub tuner in which at least three stubs are separated by a quarter guided wavelength is preferred.

The microwave power delivery system may further comprising a power measuring device configured to measure the magnitude of reflected power back towards the microwave source. The power measuring device can be utilized to monitor power usage and the power input from the microwave source can be modified accordingly.

According to one embodiment of the present invention, the microwave plasma activated CVD reactor system will comprise: a microwave generator; an isolator coupled to the generator; a three stub tuner coupled to a magic-tee junction having four ports, one of said ports being coupled to the three stub tuner, one of said ports being coupled to a power sink such as a water load, and two of said ports being coupled to plasma reactors, wherein the magic-tee is configured such that said two ports are matched and decoupled at the operating frequency of the plasma reactors, and wherein the three stub tuner is configured to tune microwaves from the generator to said operating frequency and reflect microwaves of said operating frequency from the magic-tee.

Figure 9:
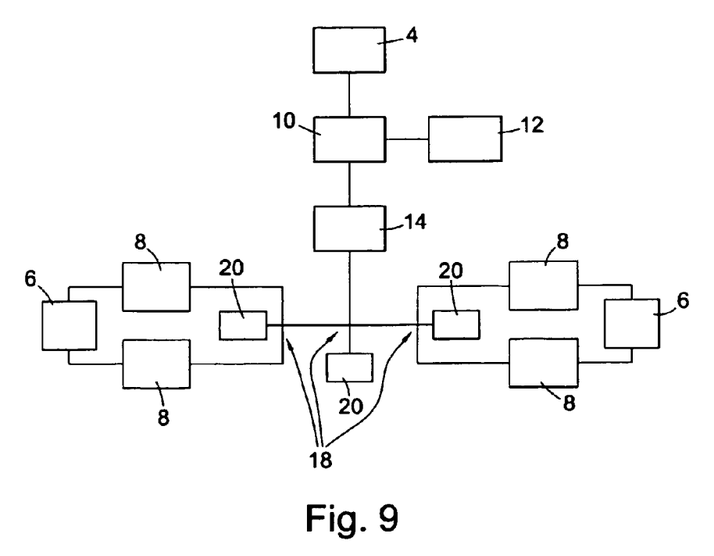
FIG. 9 illustrates a further embodiment of the present invention which comprises three waveguide junctions so as to couple four plasma reactors to a single microwave source.

Further embodiments may comprise more that one junction. For example, the aforementioned two ports may each be coupled to a further waveguide junction having the described functionality, each of the further waveguide junctions being coupled to two plasma reactors such that four plasma reactors are coupled to a single microwave generator via three waveguide junctions, a single three stub tuner, and an isolator. FIG. 9 illustrates a further embodiment of the present invention which comprises three waveguide junctions 18 so as to couple four plasma reactors 8 to a single microwave source 4. In FIG. 9, the same reference numerals as used in the previous Figures have been used for like parts. Larger networks can also be envisaged.

In principle, the power available from the microwave generator should be approximately equal to the sum of the operating powers of the plasma reactors coupled to the microwave generator. In practice, the power available from the microwave generator should be slightly greater than the sum of the operating powers of the plasma reactors coupled to the microwave generator to ensure that sufficient power is always available and account for power fluctuations. For example, optionally the power available from the microwave generator may exceed the sum of the operating powers of the plasma reactors coupled to the microwave generator by no more than 50%, 40%, 30%, 20%, 10% or 5%.

Embodiments of the present invention avoid cross-talk between a plurality of microwave plasma reactors connected to a single microwave source due to the passive design characteristics of the microwave power delivery system. Certain embodiments of the present invention can deliver power equally to a plurality of plasma rectors within ±25%, 20%, 15%, 10%, or 5% of a mean power delivered to each plasma reactor. Furthermore, microwave power delivery systems according to embodiments of the present invention can deliver a relatively constant power to each of a plurality of microwave plasma reactors over the long time periods required for CVD diamond synthesis. For example, the power delivered to each of the plurality of microwave plasma reactors may be stable within ±10%, 8%, 6%, 4%, or 2% of a mean power delivered to each plasma reactor over a time period equal to or greater than 1 hour, 2 hours, 5 hours, 10 hours, 15 hours, 24 hours, 48 hours, 7 days, 14 days, 21 days, 28 days, or more in, for example, a CVD diamond synthesis process. Non-matched reflected power (in terms of magnitude and phase) from the plurality of microwave plasma reactors is fed into a microwave sink such as a water load connected to a waveguide junction within the microwave power delivery system. The microwave power delivery system may be configured to use as much reflected power as possible in order to improve power efficiency. Microwave power delivery systems according to embodiments of the present invention may typically absorbed equal to or less than 5 kW, 3 kW, 1 kW, or 0.5 kW in the microwave sink connected to the waveguide junction. As such, the majority of reflected power can be re-used.

Microwave delivery systems in accordance with certain embodiments of this invention are thus cost effective from a hardware perspective and efficient from a power usage perspective, while also ensuring that the microwave power input to each plasma reactor remains balanced regardless of fluctuations in power usage and power reflected back into the microwave delivery system. The arrangements described herein can reduce capital cost per CVD diamond plasma reactor. Furthermore, the arrangements can increase yield of product per microwave generator and ensure that product from different plasma reactors is uniform in quality.

While this invention has been particularly shown and described with reference to certain embodiments, it will be understood to those skilled in the art that various changes in form and detail may be made without departing from the scope of the invention as defined by the appended claims.

The invention claimed is:

1. A microwave power delivery system for supplying microwave power to a plurality of microwave plasma reactors, the microwave power delivery system comprising:
a tuner configured to be coupled to a microwave source and configured to match impedance of the plurality of microwave plasma reactors to that of the microwave source; and
a waveguide junction coupled to the tuner and configured to guide microwaves to and from the plurality of microwave plasma reactors,
wherein the waveguide junction comprises four waveguide ports including a first port coupled to the tuner, second and third ports configured to be coupled to respective microwave plasma reactors, and a fourth port coupled to a microwave sink, wherein the waveguide junction is configured to evenly split microwave power input from the tuner through the first port between the second and third ports for providing microwave power to respective microwave plasma reactors, wherein the waveguide junction is configured to decouple the second and third ports thereby preventing any reflected microwaves from one of the microwave plasma reactors from feeding across the waveguide junction directly into another microwave plasma reactor causing an imbalance, wherein the waveguide junction is further configured to feed reflected microwaves received back through the second and third ports which are balanced in terms of magnitude and phase to the tuner such that they can be reflected by the tuner and re-used, and wherein the waveguide junction is further configured to feed excess reflected power which is not balanced through the fourth port into the microwave sink.

2. A microwave power delivery system according to claim 1, further comprising a microwave isolator for coupling the tuner to the microwave source.

3. A microwave power delivery system according to claim 1, wherein the tuner is a stub tuner.

4. A microwave power delivery system according to claim 3, wherein the stub tuner comprises a plurality of stubs.

5. A microwave power delivery system according to claim 4, wherein the plurality of stubs are separated by a quarter guided wavelength.

6. A microwave power delivery system according to claim 1, wherein the waveguide junction is one of a hybrid tee junction, a hybrid ring junction, and a two-hole directional coupler.

7. A microwave power delivery system according to claim 1, wherein the first, second, third and fourth ports are formed by rectangular waveguides.

8. A microwave power delivery system according to claim 1, wherein the waveguide junction is a hybrid tee junction in which the first, second and third ports lie in a plane with the first port disposed at a 90° angle relative to the second and third ports which are disposed in a straight line, and wherein the fourth port is coupled at a junction between the first, second and third ports and lies in a plane perpendicular to the first, second and third ports.

9. A microwave power delivery system according to claim 1, wherein the waveguide junction is configured to decouple the second and third ports when operating within a frequency band width in the range 400 MHz to 500 MHz, 800 MHz to 1000 MHz, or 2300 MHz to 2600 MHz.

10. A microwave power delivery system according to claim 1, wherein the second and third ports are equal in length or have a difference in length which is a multiple of $½ \lambda_g$, where $\lambda_g$ is an operating guided wavelength for the waveguide junction.

11. A microwave power delivery system according to claim 10, wherein the lengths of the second and third ports are configured to a design tolerance within 10 mm, 5 mm, 3 mm, 1 mm, 0.5 mm, or 0.1 mm and/or within 4%, 2%, 1%, 0.5%, 0.2%, 0.1% or 0.06% of a target port length.

12. A microwave power delivery system according to claim 1, further comprising a power measuring device configured to measure the magnitude of reflected power back to the microwave source.

13. A microwave power delivery system according to claim 1, wherein the system comprises a plurality of said waveguide junctions.

14. A microwave power delivery system according to claim 1, wherein the second and third ports are coupled to respective coaxial waveguides for providing microwave power to respective microwave plasma reactors.

* * * * *